United States Patent [19]

Chang et al.

[11] Patent Number: 5,161,602

[45] Date of Patent: Nov. 10, 1992

[54] GRAPHITE MOLD FOR SINGLE CRYSTAL GROWTH OF ACTIVE MATERIALS AND A PROCESS FOR MANUFACTURING THE SAME

[75] Inventors: Shih-Chin Chang, Hsinchu; Tsing-Shien Sheu, Taoyuan, both of Taiwan

[73] Assignee: National Science Council, Taipei, Taiwan

[21] Appl. No.: 736,261

[22] Filed: Jul. 22, 1991

[51] Int. Cl.$^5$ .......................... B22C 1/00; B22C 9/00; B22C 9/04
[52] U.S. Cl. ............................... 164/519; 164/122.2; 164/361
[58] Field of Search ............... 164/516, 517, 518, 519, 164/361, 122.2

[56] References Cited

U.S. PATENT DOCUMENTS 2,594,998  4/1952  Rocco ............................. 164/122.2

*Primary Examiner*—Kuang Y. Lin
*Attorney, Agent, or Firm*—Townsend and Townsend

[57] ABSTRACT

A technique of preparing graphite molds for growing single crystals of active metals and alloys. The inner surfaces of the graphite molds in contact with the growing up single crystals are of passive graphite. Various types of single crystal selectors are available in the graphite molds.

16 Claims, 4 Drawing Sheets

GRAPHITE MOLD FOR SINGLE CRYSTAL GROWTH OF ACTIVE MATERIALS AND A PROCESS FOR MANUFACTURING THE SAME

BACKGROUND OF THE INVENTION

The present invention relates to a method for growing up single crystals and especially to the growth of single crystals of highly active materials like Al or Al-Li.

High quality single crystals having low dislocation density and controllable ingredients play an important role in scientific researches and engineering applications. Generally, methods for growing single crystals include:
1) Czochralski crystal pulling technique,
2) Floating zone crystal growing technique,
3) Bridgman crystal growing technique, and
4) Directional freezing crystal growth technique, etc.

For saving time and cost, the Bridgman crystal growing technique, the directional freezing crystal growth technique, or the modifications of the above two methods often apply in the growth of single crystal materials of metals, like a single crystal superalloy turbine blade.

In the Bridgman crystal growing technique and the directional freezing crystal growth technique, starting materials are maintained in vacuum or controlled atmosphere. By adjusting the temperature gradient of materials, or by unidirectional heat dissipation, liquid metal melted from the starting materials begins to be solidified. By means of a single crystal selector, the metal crystallizes to form a single crystal. Consequently, single crystal selectors are of great importance in the above two methods. The single crystal selectors can be of different types include conical type, neck type, multiple neck type, S-shape type, Z-shape type, spiral type, etc. Due to the complexity of the shape of single crystal selectors, molds used in single crystal growth are typically investment casting shell molds manufactured from ceramic powder ($SiO_2$ or $Al_2O_3$) with proper binding materials.

When the single crystals grow up, the shell mold made of ceramic powder will be in contact with the melted metal for a long time. In particular, the ingredients of the shell mold may have bad effects on the quality and purity of the growing single crystal. When an active material grows, such as pure aluminum or aluminum alloy or magnesium alloy, the ingredients of the shell mold will react on the melted metal. As a result, the ingredients of the single crystal can hardly be controlled, and this will promote the nucleation of new grains, which is detrimental to the growth of a good single crystal. Although there are still few chances to obtain a single crystal, its dislocation density is too high to be a high quality single crystal.

The methods used for solving this problem include:
1) Using thermodynamically stable materials for ceramic shell mold, like $Al_2O_3$, $ZrO_2$, $ZrSiO_4$, etc.; or
2) Applying proper coatings on the shell mold for isolating the melted metal from the shell mold. For instance, graphite, silicon carbide (SIC), zirconium oxide ($ZrO_2$), etc. are broadly used.

These methods also have deficiencies. Ceramic powder and coatings are mixed with binding materials when they are applied to a mold. The binding materials are usually selected from the following materials: water glass (sodium silicate), silica gel solution, or ethyl silicate. After baking, there are still residue of the binding materials. The residue will react with the melted metal, which causes spalling and failure of the coating. Additionally, when the coating material is applied to the shell mold, single crystal selectors having narrow hole(s) are easily choked by the coating material, then single crystals can not grow.

In the growth of highly active materials, like pure aluminum or aluminum alloy or magnesium alloy, graphite had been found to be an ideal passive crucible material. In the other hand, commercially supplied large graphite pieces can be easily machined. Consequently, graphite had been turned into crucibles on a lathe for growing single crystals. Because of the limitation of a lathe, graphite can only be turned to form a conical cavity at the bottom of the crucible for selecting single crystals. However, a conical type single crystal selector is not a good selector, because many grains could be nucleated, and it does not have the ability of selecting a single crystal in the optimum growing direction. Therefore, the effect of such a selector is not satisfactory.

SUMMARY OF THE INVENTION

The present invention provides a method for manufacturing a graphite mold for growing active materials, and a such-made graphite mold, so as to grow high quality single crystals having low dislocation density and controllable ingredients.

Another purpose of the present invention is to provide a mold having a single crystal selector for growing single crystal. In the growth of a single crystal, the portions of the mold in contact with the melted metal are made of passive graphite materials.

According to the present invention, a process of manufacturing a graphite mold for growing single crystals comprises:
a) preparing a single crystal selector wax component having an upper end;
b) preparing a graphite mold base having a hole at the bottom of said graphite mold base, wherein the diameter of said hole is substantially identical to the diameter of said upper end of said single crystal selector wax component;
c) filling wax into said graphite mold base, and, wax welding the said single crystal selector wax component to the wax filling at the said hole, to form an assembled wax component which has an graphite shell; and
d) applying investment casting shell mold manufacturing processes on said assembled wax component to prepare a graphite mold with a single crystal selector, wherein said investment casting processes include dipping, firing and dewaxing, said graphite mold has a ceramic shell and an inner surface, said inner surface of said graphite mold in contact with growing up single crystals is of graphite.

BRIEF DESCRIPTION OF THE DRAWINGS

This invention will be explained in more detail on the basis of exemplary embodiments with reference to the drawings, in which.

DETAILED DESCRIPTION OF A PREFERRED EMBODIMENT

Figure 1:
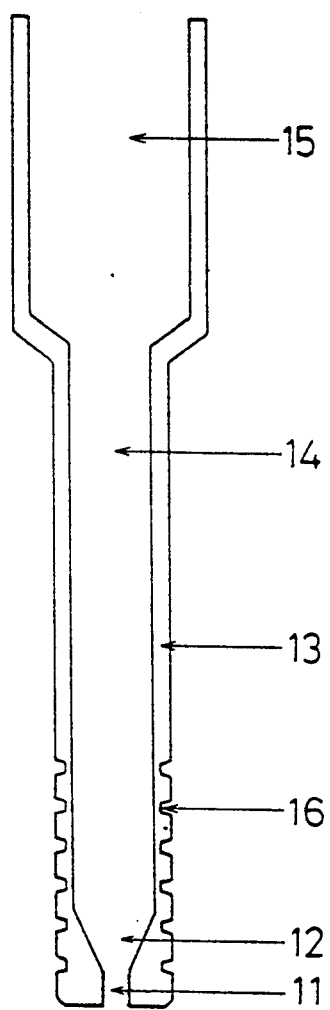
FIG. 1 is a cross-sectional view of a graphite mold base.
Figure 6:
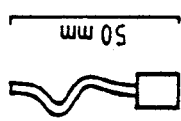
FIG. 6 is a side view of a single crystal selector wax component.

Referring to FIG. 1, a substantially cylindrical graphite mold base 13 is made by cutting, engraving, or the combination of above two methods. The cavity 14 of the mold base 13 can be of different shapes for respectively growing single crystals of different shapes. For example, the shape of cavity 14 may be a cylinder, an elliptic cylinder, a square column, a rectangle column, or a turbine blade. An upper portion 15 of cavity 14 is enlarged in order to contain appropriate amount of starting materials which are typically polycrystalline ingots. For the convenience of connecting with a single crystal selector, a bottom portion 12 of cavity 14 is conical. Furthermore, screw threads 16 near the bottom end of the mold base 13 are designed to improve adhesion of a ceramic shell to the graphite mold base 13. The bottom of the graphite mold base 13 is provided with a small hole 11. The diameter of the small hole 11 is identical to that of the upper end 23 of a single crystal selector wax component 22 (as shown in FIG. 2 and FIG. 6).

The shape of single crystal selector wax component 22 may be of different types include conical type, neck type, multiple neck type, S-shape type, Z-shape type, spiral type, or other desirable type.

Figure 2:
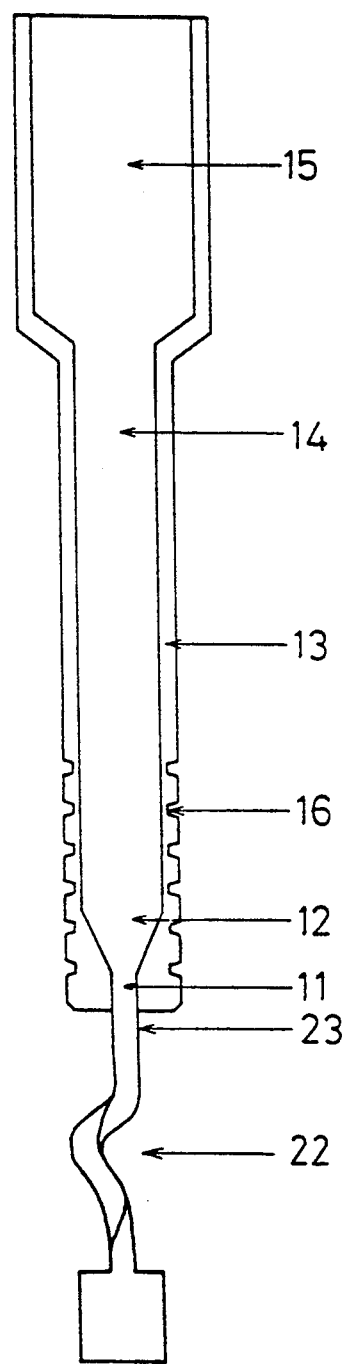
FIG. 2 is a cross-sectional view of an assembled wax component includes a graphite mold base and a single crystal selector.
Figure 3:
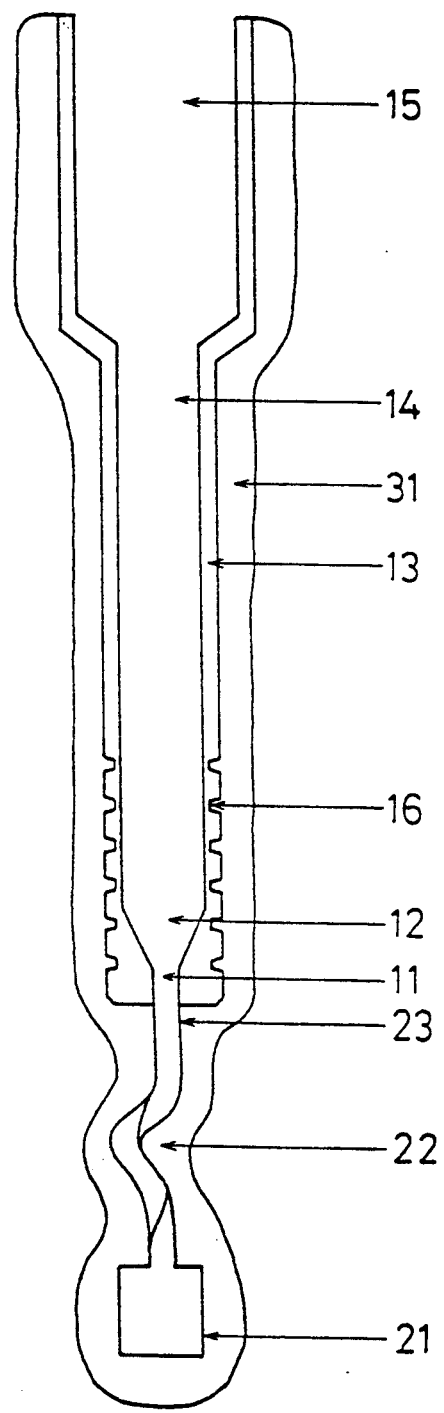
FIG. 3 is a cross-sectional view of a graphite mold according to the present invention.

As shown in FIG. 2, after the cavity 14 of the graphite mold base 13 was filled with wax, the upper end of the single crystal selector wax component 22 is wax welded to it at the small hole 11 to form an assembled wax component. Conventional method of applying the ceramic coating in the investment casting mold preparation process is then applied to the assembled wax component. After dewaxing and mold firing, a graphite mold with a single crystal selector for growing single crystals is obtained as shown in FIG. 3. The exterior 31 of the entire graphite mold is of ceramic materials which are the same as the shell mold used in conventional investment casting. The inner portion of the graphite mold in contact with the melted metal, except the single crystal selector, is graphite mold base 13.

The graphite mold made by above mentioned processes can be utilized in bridgman crystal growing technique, or directional freezing crystal growth technique to grow single crystals. First, starting material pieces are put into the cavity 14 and then melted in vacuum or controlled atmosphere. After that, the melted metal are gradually cooled, in the direction from the bottom end 21 of the single crystal selector 22 to the top of the mold, which promotes the nucleation of new grains. While these grains grow up, only one of them can pass the single crystal selector, and will grow into the cavity 14. Then, the single crystal which grows up in the cavity 14 will only be in contact with passive graphite mold base 13. Therefore, the reactions between the melted metal and the materials of the ceramic shell mold is prevented. High quality single crystals having low dislocation density and controllable ingredients are thus obtained.

Figure 5:
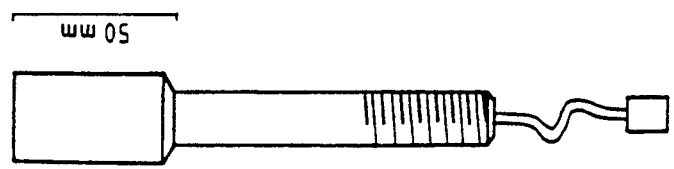
FIG. 5 is a side view of a graphite mold base.
Figure 4:
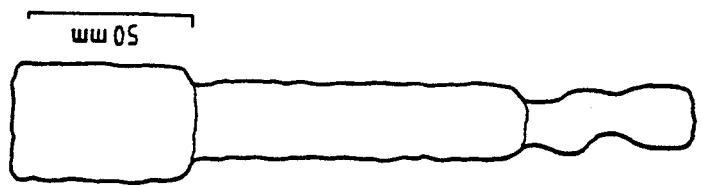
FIG. 4 is a side view of a graphite mold according to the present invention.

Described hereafter is one of the examples of various embodiments according to the present invention. This is a descriptive but not limitative example for more clearly understanding. FIG. 4 shows a graphite mold according to the present invention. FIG. 5 shows a graphite mold base used in the graphite mold shown in FIG. 4, which is turned from a cylindrical graphite piece by a lathe. The upper portion of cavity of this graphite mold base has an inner diameter of 30 mm, and an outer diameter of 36 mm. The cavity of this graphite mold base, where a single crystal grows up, has an inner diameter of 15 mm, and an outer diameter of 21 mm. The bottom portion of cavity of this graphite mold base is conical. A small hole with an inner diameter of 4.5 mm is provided at the bottom surface of this graphite mold base. A spiral single crystal selector wax component shown in FIG. 6 is utilized.

About 80 g starting materials of pure aluminum and Al-Li alloy are respectively filled into two graphite molds as shown in FIG. 4. By bridgman crystal growing technique, under the controlled atmosphere of pure argon, single crystal rods of pure aluminum and Al-Li alloy grow in a velocity of $5 \times 10^{-6}$ m/s. The characteristics of these single crystal rods are as follows:

1) There is only a single crystal above the single crystal selector.
2) The chemical compositions of these single crystals are critically uniform. For instance, the variation of chemical composition of the single crystal, which grows up from a starting material of 99.8% pure aluminum, is unmeasurable. In another example, with a starting material of Al-3% Li alloy, the Li loss of the single crystal is less than 15%. This result is better than those in recent reference papers, for example, Y. Miura, A. Matsui, M. Furukawa and M. Nemoto, in: Aluminum-Lithium III, Ed. C. Baker, P. J. Gregson, S. J. Harris and C. J. Peel (The Institute of Metals, London, 1986) p. 427.
3) The dislocation densities of the pure aluminum and Al-Li alloy single crystals are respectively $1.72 \times 10^8$ m$^{-2}$ and $9.11 \times 10^7$ m$^{-2}$, which are one or two orders of magnitude lower than prior arts.

What is claimed is:

1. A process of manufacturing a graphite mold for growing up single crystals, which comprises:
   a) preparing a single crystal selector wax component having an upper end;
   b) preparing a graphite mold base having a hole at the bottom of said graphite mold base, wherein the diameter of said hole is substantially identical to the diameter of said upper end of said single crystal selector wax component;
   c) filling wax into said graphite mold base, and, wax welding said single crystal selector wax component in said hole, to form an assembled wax component which has an graphite shell; and
   d) applying investment casting mold manufacturing processes on said assembled wax component to prepare a graphite mold with a single crystal selector, wherein said investment casting mold manufacturing processes include dipping, firing and dewaxing, said graphite mold has a ceramic shell and an inner surface, said inner surface of said graphite mold in contact with growing up single crystals is of graphite.

2. A graphite mold for growing single crystals, produced from the process as claimed in claim 1.

3. A graphite mold for growing single crystals, which comprises:

a mold body having a bottom end and an upper end, said mold body has a graphite inner portion and a ceramic outer portion; and a ceramic single crystal selector connected to said bottom end of said mold body, wherein a single crystal grows in said graphite inner portion.

4. A graphite mold as claimed in claim 3, wherein said upper end of said mold body is enlarged.

5. A graphite mold as claimed in claim 3, wherein the outer surface of the bottom end of said graphite inner portion is provided with screw threads.

6. A graphite mold as claimed in claim 3, wherein said bottom end of said mold body has a substantially conical cavity formed therein.

7. A graphite mold as claimed in claim 3, wherein said graphite inner portion of said mold body has a substantially cylindrical cavity formed therein.

8. A graphite mold as claimed in claim 3, wherein said graphite inner portion of said mold body has a substantially elliptic cylindrical cavity formed therein.

9. A graphite mold as claimed in claim 3, wherein said graphite inner portion of said mold body has a substantially square-column-like cavity formed therein.

10. A graphite mold as claimed in claim 3, wherein said graphite inner portion of said mold body has a substantially rectangle-column-like cavity formed therein.

11. A graphite mold as claimed in claim 3, wherein said graphite inner portion of said mold body has a substantially turbine-blade-like cavity formed therein.

12. A graphite mold as claimed in claim 3, wherein said ceramic single crystal selector is of neck type.

13. A graphite mold as claimed in claim 3, wherein said ceramic single crystal selector is of multiple neck type.

14. A graphite mold as claimed in claim 3, wherein said ceramic single crystal selector is of S-shape type.

15. A graphite mold as claimed in claim 3, wherein said ceramic single crystal selector is of Z-shape type.

16. A graphite mold as claimed in claim 3, wherein said ceramic single crystal selector is of spiral type.

* * * * *